United States Patent
Van Der Wijst

(10) Patent No.: US 7,570,946 B2
(45) Date of Patent: Aug. 4, 2009

(54) METHOD FOR DETERMINING THE SIGNAL STRENGTH AT THE INPUT OF A TUNER

(75) Inventor: Hendricus Martinus Van Der Wijst, Veldhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/496,553

(22) PCT Filed: Nov. 25, 2002

(86) PCT No.: PCT/IB02/05196

§ 371 (c)(1),
(2), (4) Date: May 25, 2004

(87) PCT Pub. No.: WO03/047098

PCT Pub. Date: Jun. 5, 2003

(65) Prior Publication Data
US 2005/0001158 A1    Jan. 6, 2005

(30) Foreign Application Priority Data
Nov. 28, 2001    (DE) ................................ 101 58 274

(51) Int. Cl.
*H04W 24/00*    (2006.01)
(52) U.S. Cl. .................. 455/423; 455/13.4; 455/24; 455/193.1; 455/194.2; 455/226.1; 455/226.2; 455/227

(58) Field of Classification Search ............. 455/67.11, 455/67.14, 234.1, 232.1, 138, 150.1, 177.1, 455/200.1, 423, 77, 13.4, 24, 193.1, 194.2, 455/226.1, 226.2, 227; 702/107, 60, 61
See application file for complete search history.

(56) References Cited

U.S. PATENT DOCUMENTS

| | | | | |
|---|---|---|---|---|
| 4,733,301 A | * | 3/1988 | Wright, Jr. ................... | 348/731 |
| 5,469,115 A | * | 11/1995 | Peterzell et al. ............. | 330/129 |
| 6,169,428 B1 | * | 1/2001 | Mader ........................ | 327/101 |
| 6,650,375 B1 | * | 11/2003 | Maeda ........................ | 348/724 |
| 6,782,335 B1 | * | 8/2004 | Lynaugh et al. ............. | 702/107 |

\* cited by examiner

*Primary Examiner*—Patrick N. Edouard
*Assistant Examiner*—Justin Y Lee

(57) ABSTRACT

The invention relates to a method for determining the strength of a signal (18) at the input of a tuner (1*a*.) In this, the frequency-dependent amplification characteristic for the tuner is measured and stored in a memory assigned to the tuner. With the help of this characteristic the frequency-dependent variation of the amplification can be compensated during tuner operation, in order that the input signal strength can be deduced more precisely. For a tuner with automatic gain control (AGC), the frequency dependence of the AGC can also be recorded and stored in the memory by representative characteristics. The consideration of the AGC characteristics results in a further improvement to the precision of estimation of the input signal strength.

10 Claims, 6 Drawing Sheets

METHOD FOR DETERMINING THE SIGNAL STRENGTH AT THE INPUT OF A TUNER

Figure 1:
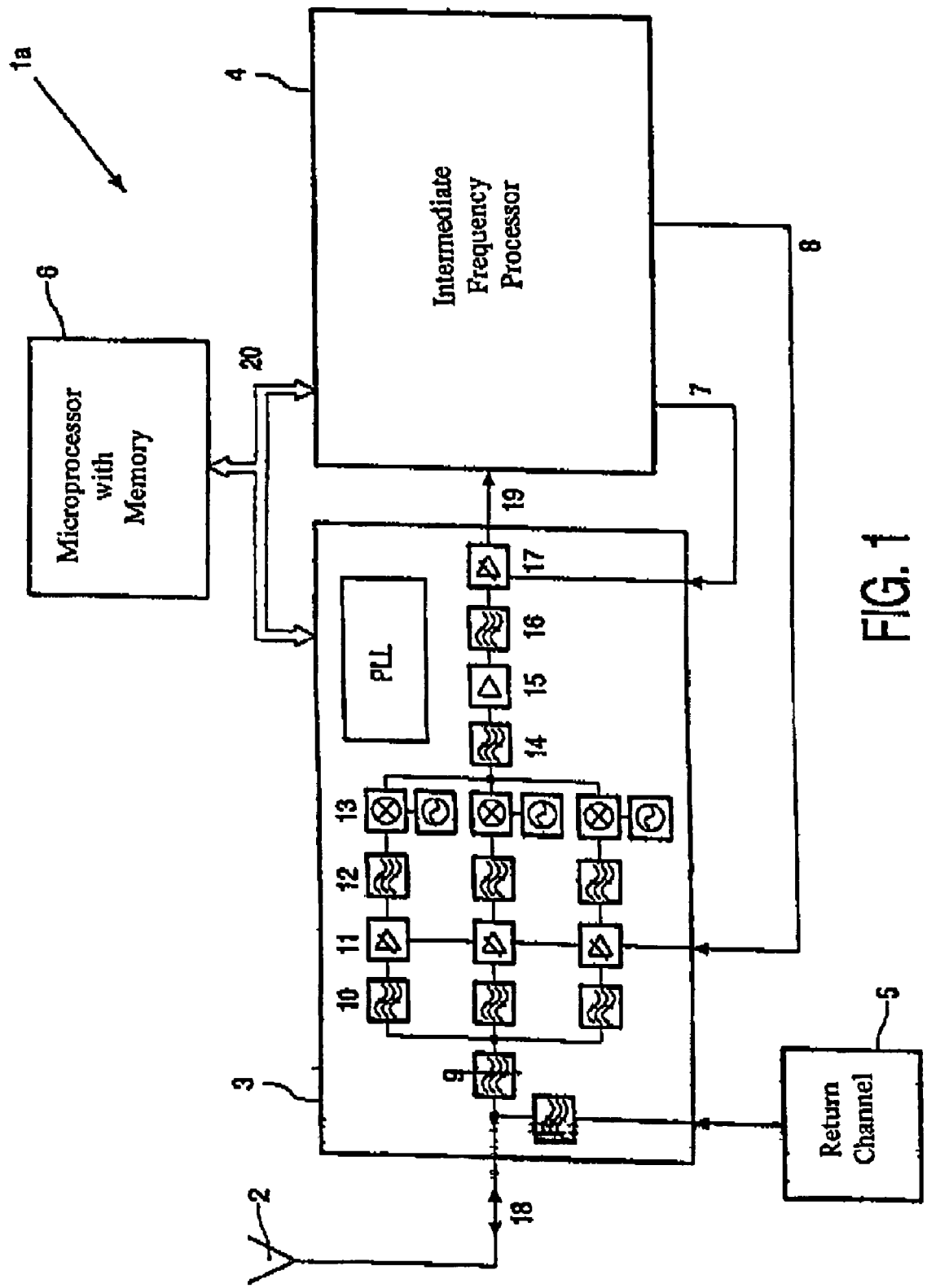

The invention relates to a method for determining the signal strength at the input of a tuner, and also to a tuner with a phase-locked loop for selective amplification and mixing of at least one frequency band from an input signal.

Tuners are used, for instance, in a television or radio receiver to filter out one or more frequency bands ("channels") from the incoming signals picked up by an antenna, to amplify them and if applicable convert them into an intermediate frequency. The frequency of these input signals is typically in the range between fifty and one thousand MHz.

For optimal setting of the tuner, it is important to know as precisely as possible the signal strength of the input signal to be filtered out. This signal strength can vary with time because of fluctuating reception conditions (field strengths). The determination of the signal strength is made more difficult by the fact that the amplification characteristic of the tuner depends on the frequency of the amplified signal. Furthermore, many tuners have a feedback gain control, in which a control signal provides for an automatic gain reduction, in order to prevent overload and to keep the tuner's output signal as close as possible to an optimal value. The characteristics of these gain controls are also dependent on the frequency of the amplified input signal. The conventional determination of the input signal strength from the tuner's output signal is thus generally subject to considerable lack of precision.

Against this background, it was an object of the present invention to provide a method and a tuner equipped to execute the method, with which a more precise determination of the signal strength is possible at the input of the tuner.

This object is achieved by a method with the features of claim 1 and by a tuner with features of claim 6. Advantageous embodiments are contained in the subclaims.

In the method according to the invention for determining the signal strength at the input of a tuner, the amplification characteristic for the tuner is first measured and stored depending on the input signal frequency. Here the amplification characteristic reflects the relationship between the value of the output signal and the value of the input signal of the tuner for a specific frequency of the input signal. This amplification characteristic can vary from tuner to tuner because of construction-related fluctuations. The resolution with which the amplification characteristic is stored is based on the size of the memory area provided and on the desired precision. The stored characteristic is then used during the operation of the tuner to calculate the signal strength at the tuner's input from the tuner's output signal. In this calculation the frequency-dependent variation of the amplification can be included and largely compensated, resulting in a much more precise estimate of the input signal strength.

According to a development of the method, the amplification of the tuner is automatically reduced by means of at least one control signal, in order to prevent an overload and to obtain a predefined signal strength at the tuner's output. This regulation of the tuner's amplification ensures that it is operated as far as possible in its optimal range.

The amplification of the tuner is preferably reduced automatically here to at least two different frequency ranges, into which an input signal is successively converted. That is, a first gain reduction is made on the input signal itself and a second gain reduction is then made on the signal thus obtained with an intermediate frequency (so-called "double conversion").

A method with at least one automatic gain reduction is preferably developed in such a way that the characteristic of the automatic gain reduction is measured and stored dependent on the frequency of the input signal and the control signal by which the gain reduction is driven. For several gain reductions, several characteristics can accordingly be measured and stored. Subsequently, in the operation of the tuner, the stored characteristics of the gain reductions can be used for calculating the signal strength at the tuner's input from the tuner's output signal. In this way the further frequency-dependent variations in the tuner's amplification action can be recorded and compensated.

In addition, further characteristic quantities of the tuner, such as especially an identification of the device and optimal parameter settings, can be stored and used during tuner operation for optimization purposes. These values can be stored in the memory provided for storing the characteristics.

The invention also relates to a tuner with a phase-locked loop for selective amplification and mixing of at least one frequency band from an input signal. The tuner further contains a storage unit and a signal-processing unit linked to it, the signal-processing unit being equipped to execute a method of the kind cited above. That is, the signal-processing unit can calculate the signal strength at the tuner's input from the tuner's output signal, with the help of characteristics stored in the storage unit. Such a tuner supplemented with a storage unit allows a much more precise determination of the signal strength at the input.

The storage unit used can be realized in particular by a non-volatile memory (ROM, PROM, EPROM, EEPROM etc.). This allows the necessary characteristics to be measured once when the tuner is manufactured, and stored with suitable resolution in the memory, where it is then preserved for future use for the remaining lifetime of the tuner.

The tuner is preferably connected to a send-and-receive antenna. Such a configuration is present, for example, in the so-called set-top boxes, which enable interactive television or radio reception, in which the user can send back signals to the program transmitter.

The tuner can further be embodied in such a way that it contains one or two frequency conversion stages. In frequency conversion stages, the input signal is initially converted into a first intermediate frequency, which is then transformed into a second intermediate frequency.

The tuner is preferably equipped for processing analog or digital television signals.

Figure 2:
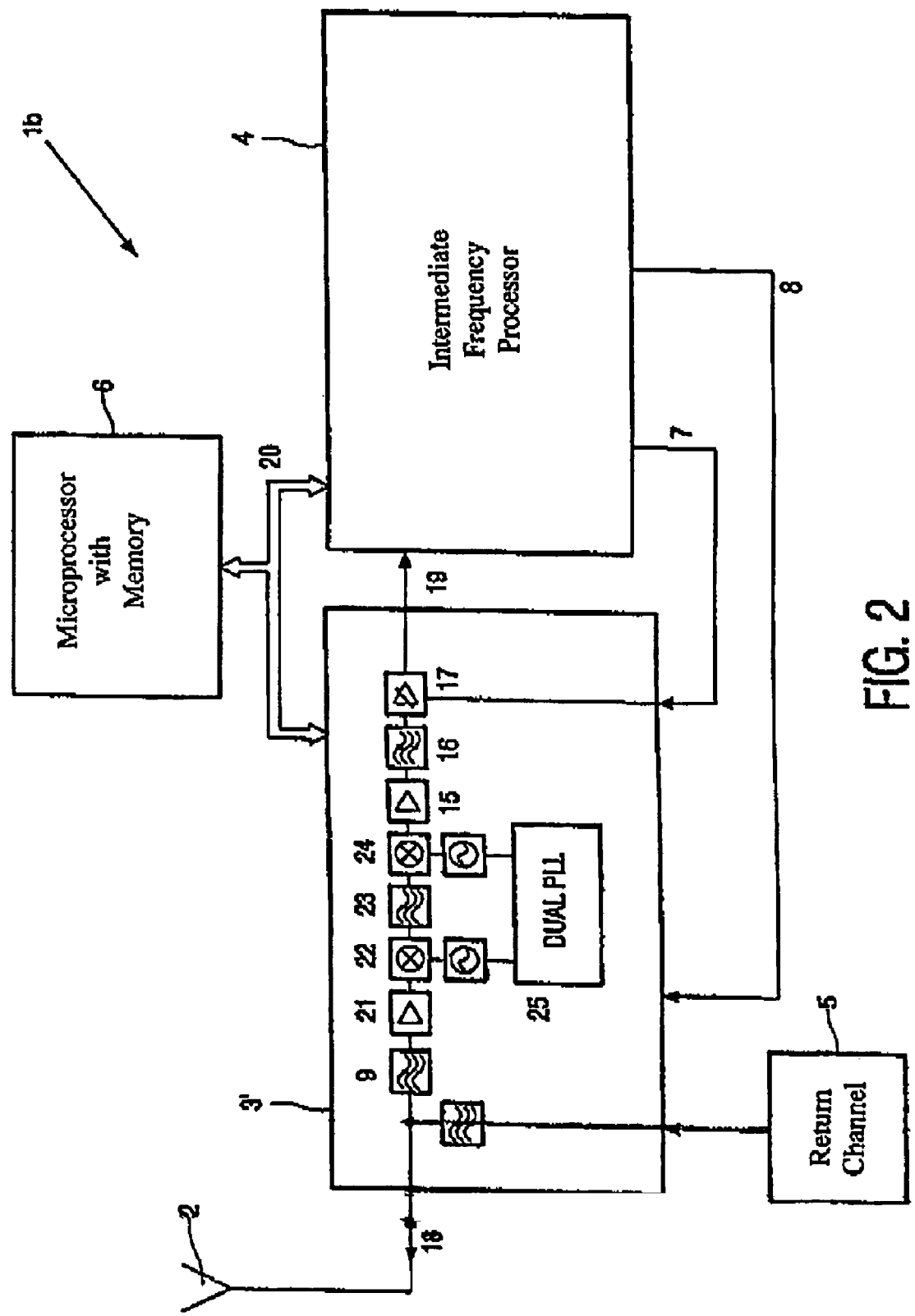
Figure 3:
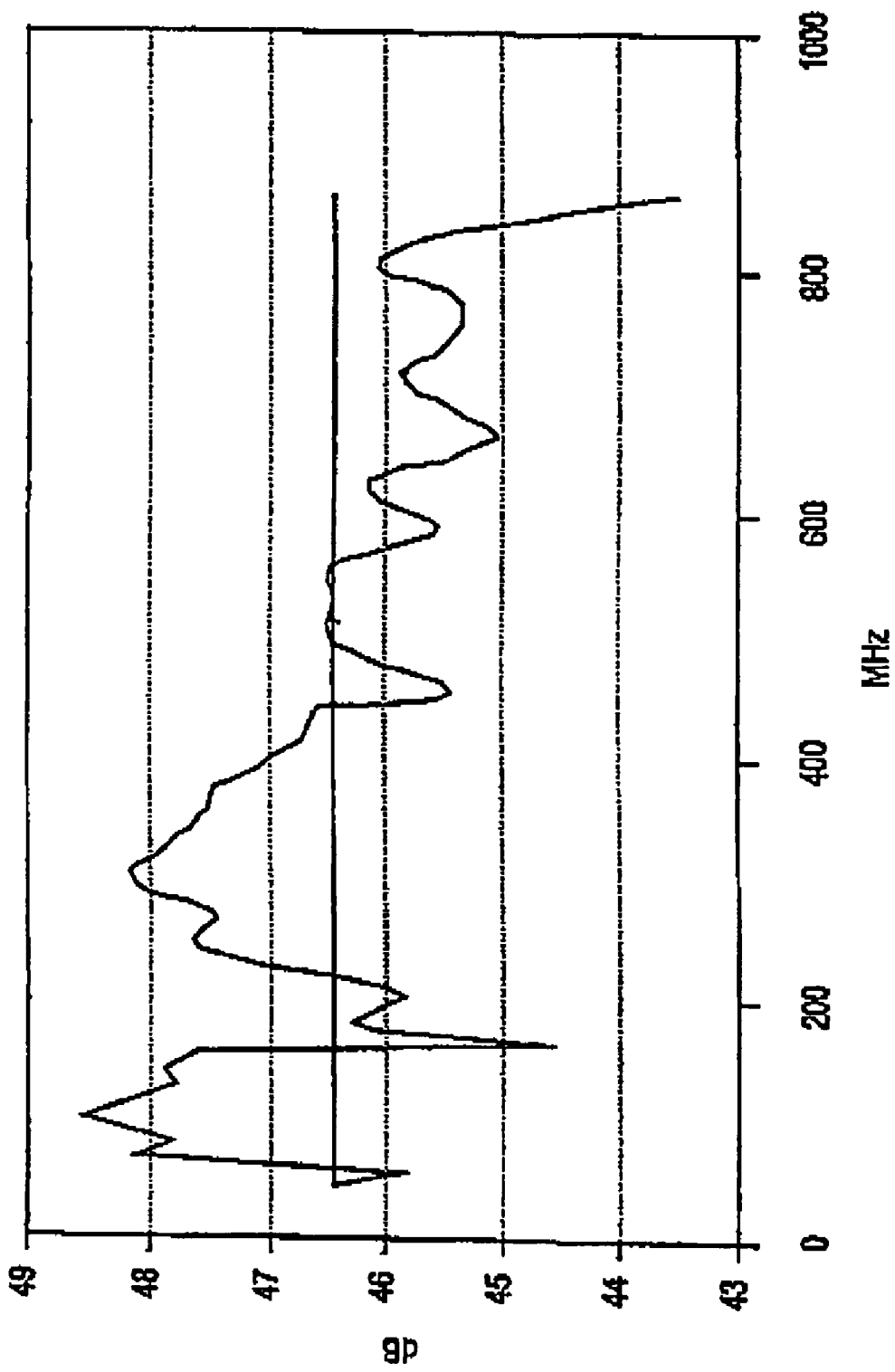
Figure 4:
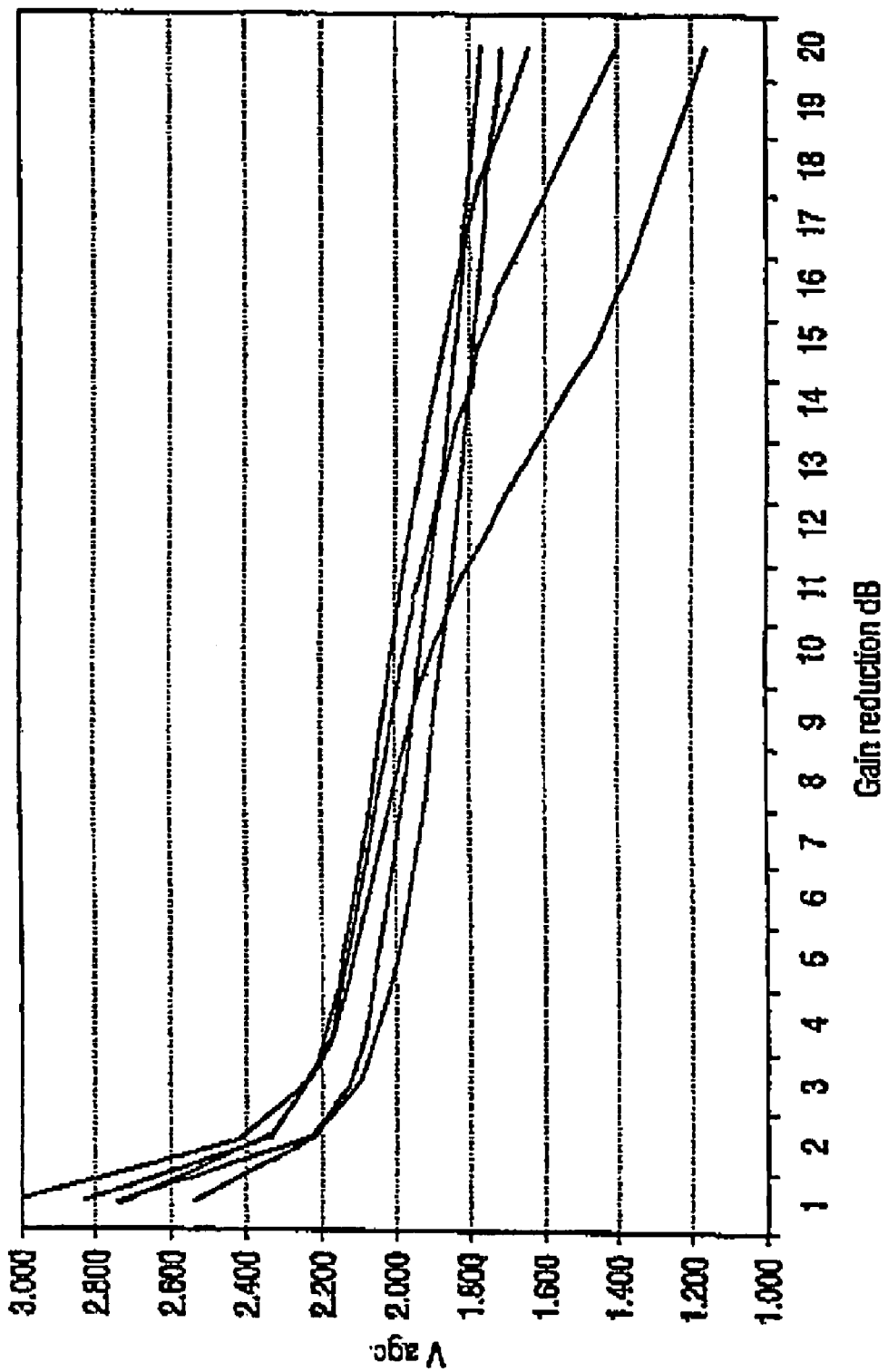
Figure 5:
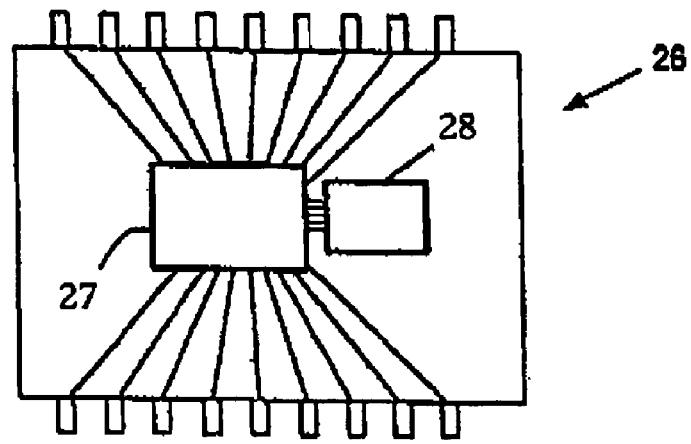
Figure 6:
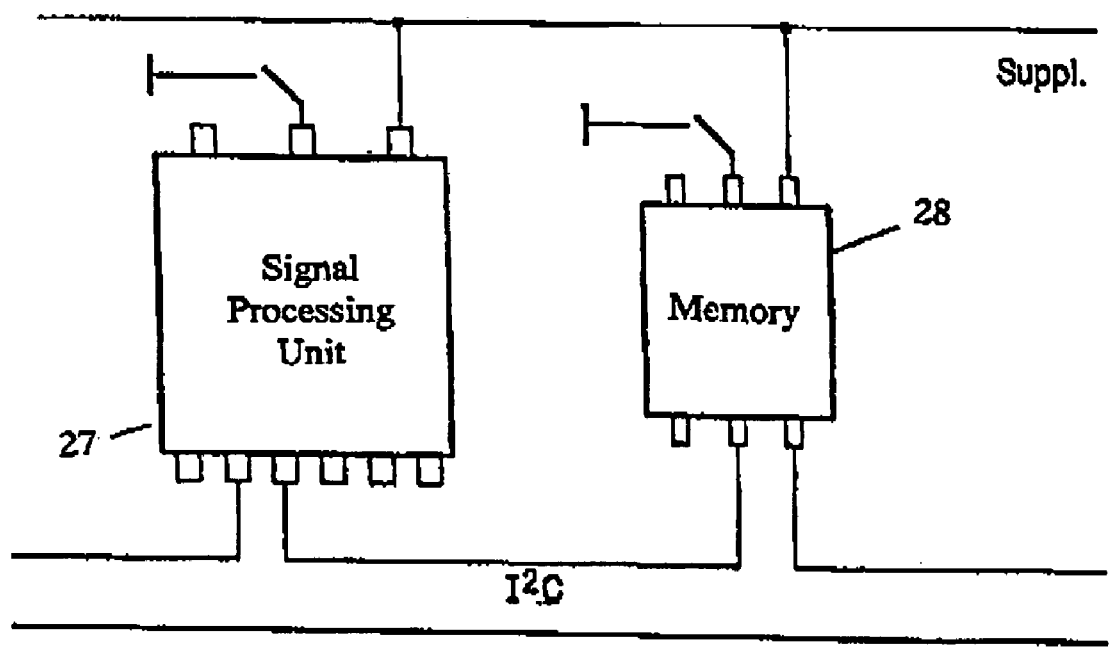
Figure 7:
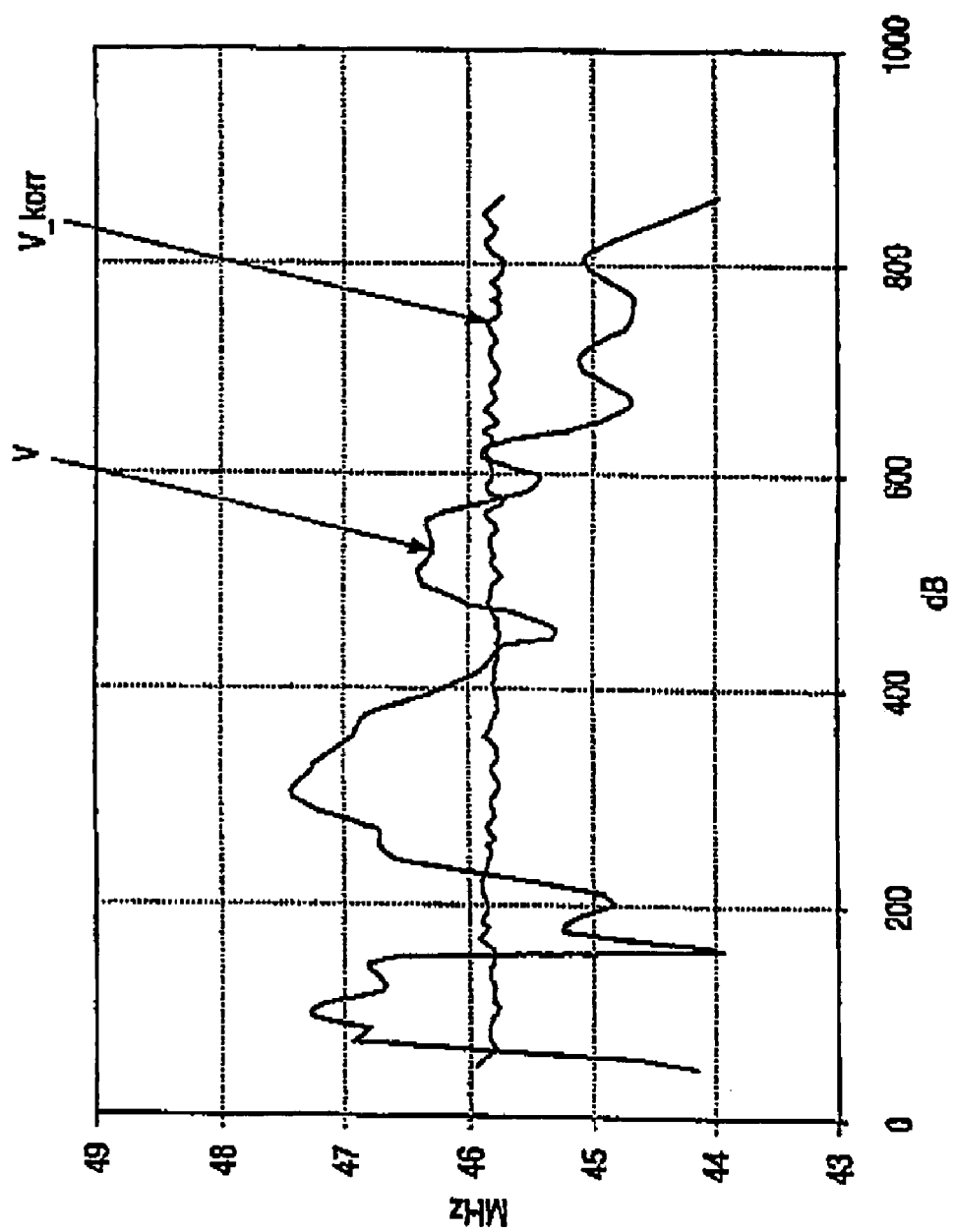

The invention will be further described with reference to examples of embodiments shown in the drawings to which, however, the invention is not restricted. Shown are:

FIG. 1 a diagram of a tuner with a single conversion stage;

FIG. 2 a diagram of a tuner with two conversion stages;

FIG. 3 the overall amplification of the tuner, dependent on the frequency of the input signal;

FIG. 4 the dependence of the gain reduction on the value of the control signal for various frequencies;

FIG. 5 the arrangement of integrated circuits for a tuner according to the invention;

FIG. 6 an alternative arrangement of integrated circuits for a tuner according to the invention;

FIG. 7 the result of a consideration of amplification characteristics according to the invention.

In FIGS. 1 and 2, tuners 1a and 1b respectively are shown, as they can be used for set-top boxes. In the tuner 1a from FIG. 1, the input signal 18 coming from an antenna 2 is initially selectively amplified in a phase-locked loop 3 (PLL) in various frequency bands, and then converted to an intermediate frequency. In the process, the input signal 18 goes through a high-pass filter 9 and then three parallel branches with three frequency ranges dependent on the receiving channel, the branches each having a first bandpass filter 10, a controllable amplifier 11, a second bandpass filter 12 and a mixer 13.

The converted input signals then go through a third bandpass filter 14, an amplifier 15, a fourth filter 16 (typically an SAW or surface acoustic wave filter) and a controllable amplifier 17. The output signal 19 obtained from this is then routed to an intermediate frequency processor 4. The intermediate frequency processor 4 influences the amplification of the phase-locked loop 3 at two points. In the first place this occurs via a control signal 8 to the amplifier 11 ("tuner AGC"), otherwise via an intermediate frequency control signal 7 to the amplifier 17 ("intermediate frequency AGC"). The control signal 7 here works in a range of low signal strengths, until the level of the intermediate frequency reaches a specific threshold (tuner TOP of the tuner AGC: Take Over Point). Beyond this threshold, the control signal 8 comes into play.

Also present is a microprocessor 6 with a memory, which is linked by data lines 20 with both the phase-locked loop 3 and the intermediate frequency processor 4, and influences these in the manner explained below.

The user can transmit signals over a return channel 5 through the antenna 2, for example to select program content with a set-top box, and to inform the program provider about the signal strength.

The tuner 1b shown in FIG. 2 differs from that in FIG. 1 (with a simple conversion) in that the input signal 18 is subjected to a double conversion (frequency conversion). For this purpose, the input signal goes in succession through a low-pass filter 9, an amplifier 21, a first mixer 22, a first bandpass 23, a second mixer 24, an amplifier 15, a second bandpass 16 and a controllable amplifier 17. Both mixers 22 and 24 are driven by a dual phase-locked loop 25.

Set-top box applications with cable signals going in both directions require precise identification of the signal strengths. The antenna levels can vary here between 50 dBμV and 75 dBμV or in cable systems even beyond these specified levels.

Tuner 1a or 1b selects, amplifies and converts a channel to an intermediate frequency (IF). The converted IF channel is then further amplified and converted from an analog signal into a digital signal (ADC). In analog TV systems, the IF channel must be sufficiently amplified before a demodulation takes place.

To avoid overload, an automatic gain control (AGC) is used in tuner 1a, 1b. The amplification, the filtering and the AGC characteristic depend on the radio frequency (RF) of the input signal. For digital reception tuners, the single and the double frequency conversion are used. A single conversion as represented in FIG. 1 shows a very much higher variation in the amplification and filter characteristics compared to tuners with double conversion (FIG. 2). The variation in the amplification as a function of the received frequency leads to lack of precision in the identification of the signal strength at the antenna 2.

The present invention solves this problem for both a tuner with a single conversion and one with two-stage conversion, this solution being needed especially for tuners with a single-stage conversion, for fulfilling corresponding quality requirements.

The solution consists in storing relevant data in a memory in the tuner, the data containing characteristics of the amplification as a function of the frequency and of the antenna level and the AGC characteristic. This data can be obtained during adjustments and measurements in the production process without additional equipment or an increased processing time.

As well as with the data for a precise detection of signal strength, the memory can also be programmed with any other data that permits improved operation and optimal settings depending on the channel. These include for example settings of the charge pumps in the phase-locked loop, which are related to the tuning slope, or tilt corrections. An option of this kind can also be used for analog applications, in order to improve the performance or generate additional features.

For a satellite receiver, a display of the signal strength can be used in order to align the dish. A precise signal strength display is further a good basis for a mobile reception, the antenna diversity being controlled by the antenna levels.

The amplification of the tuner is maximal, until a certain level is reached. This level at the tuner's intermediate frequency output 19 is called the TOP level (Take Over Point). The TOP level can be adjusted manually or programmed. When the amplified and converted level is beyond the programmed TOP level for the tuner 1a or 1b, the AGC voltage 7 or 8 respectively is reduced until the TOP level is reached. The antenna level at which the amplification is checked is: 105 dBμV (TOP) −45 dBμV (typical amplification)=60 dBμV. The AGC voltage controls the amplification of the tuner, in order to achieve a constant intermediate frequency output level (TOP). The antenna level can be determined by characterization of the AGC voltage against the gain reduction.

The amplification and the gain reduction are established during the tuner manufacturing process, and stored in the memory at a frequency-related address. The amplification data is preferably determined here in intervals of 8 MHz. The gain reduction characteristics need one lookup table for a low band (48-160 MHz), two for the medium band (160-450 MHz) and four for the high band (450-850 MHz).

For signals below the AGC starting level (60 dBμV), it is necessary to determine the intermediate frequency level in the intermediate-frequency amplifier. A similar gain control is used in this section. The intermediate frequency is amplified with a maximum amplification, until the intermediate frequency TOP is reached. The intermediate frequency TOP is reached at about 30 dBμV antenna level. So a display of the antenna level is possible beyond this level. The characteristic for the intermediate frequency gain reduction is the same for all channels, so that one lookup table is sufficient.

Determining the level requires precise data, in order to obtain the level display with an accuracy within 2 dBμV:
  amplification characteristics for every channel
  AGC characteristics for every channel
  Tuner TOP level
  Intermediate frequency TOP level
  Intermediate frequency AGC characteristic.

FIG. 3 shows the amplification (in dB) as a function of the radio frequency (in MHz) of the input signal 18. It can be seen here that the maximum gain variation is 5 dB. In order to obtain an accuracy of 1 dB, it is necessary to know the gain with an accuracy of at least 0.5 dB.

In the final testing in tuner production, all channels of the tuner are swept. The amplification can thus be translated into data and stored in the memory, the address in the memory being related to the frequency. The amplification is measured between 48.25 MHz and 855.25 MHz in steps of 8 MHz each. The number of bits used in the memory can be defined dependent on the desired accuracy. For example, the amplification can be expressed in 256 steps (8 bits) in a range of 20 dB (LSB 0.078125 dB) between 38 and 58 dB. That is, 45 dB is stored as (45−38)/0.078125=89.

Two bytes of data are thus available for each frequency. The first byte stands for the gain, the second byte with 3 bits for the AGC reference curve and 5 bits for the tuning slope. In FIG. 7 the uncorrected amplification V is compared with the corrected amplification V_korr. The use of 8 bits here shows excellent accuracy for the amplification.

In FIG. 4 the AGC characteristics are plotted for a few frequencies. Each individual characteristic reflects the dependence between the control voltage 8 (Vagc) and the gain reduction caused by this. It can be seen from the curves that for some AGC voltages, the reduction in gain when applying the same control voltage can vary under different frequencies by up to ±10 dB. Since the AGC characteristics are comparatively complex curves, a lookup table cannot be stored for each channel in a limited memory. This is non-prejudicial, however, as a particular characteristic is valid over a certain frequency range. Depending on the desired accuracy, it is therefore sufficient to store only a few (typically 5 to 10) reference curves for the entire frequency spectrum. For storing the curves, the gain reduction is measured for each channel between 1 and 20 dB. The voltage is translated into an integer with a resolution of typically 14 bits after analog-to-digital conversion.

To reduce the memory requirement, it is further possible to determine (piecewise) linear approximations for the AGC characteristics, and only store the parameters for these approximations.

Since it is there, the memory provided in the tuner for storing the characteristics can also advantageously be used for other relevant data. This includes, for example

- an identification of the tuner type, the date of production and the revision code
- Data for process identification
- Band limits (band programming)
- Tilt characteristics (amplitude difference between vision and sound carriers)
- Optimal settings for the phase-locked loop (setting of the charge pump, tuning slope etc.).

With the help of this additional data, the application software can recognize the tuner type and use the optimal setting.

FIG. 5 shows a possibility for accommodating the additional memory 28 in a multi-chip assembly. The low-cost memory chips are manufactured with a technology differing from that used for the tuner's integrated circuits (MOPLL=mixer oscillator+phase-locked loop). The multi-chip assembly 26 can be used to combine these two ICs, as all connections for the memory are already used for the MOPLL, which is controlled by IIC. So no extra connections are needed on the MOPLL-IC. This saves corresponding space on the printed circuit board.

FIG. 6 shows an alternative solution, in which the memory 28 is connected separately from the signal-processing unit 27 to an I²C bus.

The nature of the memory chip 28 can be a one-time programmable chip or preferably an EEPROM. The latter has the advantage that the data can be refreshed, or can be used during the production process for the history of the process. The required memory capacity is typically 1K depending on the accuracy and the performance spectrum.

A variant without the addition of memory is naturally also feasible within the scope of the invention, making use of memory that is already present. For this, data could be collected during the manufacture of the tuner, transported by means of a diskette, a network or in some other way, and stored in the system's available memory.

The method according to the invention for determining the input signal strength can be used for analog TV, digital TV, automobile TV, set-top boxes for cable or satellite and/or for equipment for measuring the antenna level.

REFERENCE LABEL LIST 1a tuner
1b tuner
2 antenna
3 phase-locked loop
4 intermediate frequency processor
5 return channel
6 microprocessor
7 intermediate frequency control signal
8 control signal
9 high-pass filter
10 bandpass filter
11 amplifier
12 bandpass filter
13 mixer
14 bandpass filter
15 amplifier
16 filter
17 amplifier
18 input signal
19 output signal
20 data line
21 amplifier
22 mixer
23 bandpass
24 mixer
25 phase-locked loop
26 multi-chip assembly
27 signal-processing unit
28 memory chip

The invention claimed is:

1. A method for determining the signal strength at an input of a tuner, an amplification characteristic of an amplification section for receiving and amplifying an input signal and outputting an output signal of the tuner being measured and stored depending on the input signal frequency, and the stored characteristic then being used during the operation of the tuner to calculate the signal strength at the tuner's input from the tuner's output signal;
   adjusting a gain of the amplification section by a tuner automatic gain control (AGC) circuit adapted to receive a tuner AGC feedback voltage,
   storing data corresponding to two or more tuner AGC reference gain curves measured at two or more corresponding input frequencies; and
   storing each tuner AGC reference gain curve in a corresponding plurality of selected memory locations, each of the selected memory locations corresponding to an tuner AGC gain reduction level and storing therein a measured tuner AGC feedback voltage when the tuner AGC circuit has the corresponding tuner AGC gain reduction and when the input signal has the corresponding input frequency.

2. A method as claimed in claim 1, wherein the amplification of the tuner is reduced by means of at least one control signal, in order to obtain a predefined strength for the tuner's output signal.

3. A method as claimed in claim 1, further comprising:
   storing the measured frequency tilt data in memory; and
   using the stored frequency tilt data during turner operation.

4. A tuner, comprising:
an amplification section adapted to receive and amplify an input signal and to output an output signal;
a memory device including a plurality of memory locations, each of the memory locations corresponding to a different input frequency and storing therein a measured gain of the amplification section when the input signal has the corresponding input frequency; and
a signal processing unit adapted to calculate a strength of the input signal at an actual input frequency using a strength of the output signal and the measured gain of the amplification section stored in the memory location corresponding to the actual input frequency of the input signal;
wherein the amplification section further comprises a tuner automatic gain control (AGC) circuit adapted to receive a tuner AGC feedback voltage and in response thereto to adjust the gain of the amplification section, wherein the memory device further stores data corresponding to two or more tuner AGC reference gain curves measured at two or more corresponding input frequencies; and
wherein the memory device stores each tuner AGC reference gain curve in a corresponding plurality of selected memory locations, each of the selected memory locations corresponding to an tuner AGC gain reduction level and storing therein a measured tuner AGC feedback voltage when the tuner AGC circuit has the corresponding tuner AGC gain reduction and when the input signal has the corresponding input frequency.

5. The tuner of claim 4, wherein each of the selected memory locations corresponds to a different input power level in steps of 1 db.

6. The tuner of claim 4, wherein each of the memory locations corresponding to a different input frequency further stores an identifier of one of the two or more tuner AGC reference curves which applies to the corresponding input frequency, and wherein the signal processing unit calculates the strength of the input signal at the actual input frequency using the AGC reference curve identified in the memory location corresponding to the actual input frequency.

7. The tuner of claim 6, wherein each of the memory locations corresponding to a different input frequency further stores data corresponding to a different input frequency further stores data corresponding to a frequency slope of the tuner at the corresponding input frequency.

8. The tuner of claim 4, wherein the amplification section further comprises an intermediate frequency (IF) automatic gain control (AGC) circuit adapted to receive an IF AGC feedback voltage and in response thereto to adjust the gain of the amplification section, wherein the memory device further stores data corresponding to an IF AGC reference gain curve.

9. The tuner of claim 4, wherein the amplification section includes at least two frequency converters.

10. The tuner of claim 4, wherein the memory device stores the amplification characteristic as a plurality of gain values each corresponding to a different frequency of the tuner, wherein each data value corresponds to the gain of the amplifier in dB at the corresponding frequency.

* * * * *